United States Patent
Nozaki

(10) Patent No.: US 7,259,563 B2
(45) Date of Patent: Aug. 21, 2007

(54) MAGNETIC RESONANCE IMAGING APPARATUS AND ITS CONTROL METHOD

(75) Inventor: Seiji Nozaki, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 0 days.

(21) Appl. No.: 11/353,019

(22) Filed: Feb. 14, 2006

(65) Prior Publication Data
US 2006/0181278 A1 Aug. 17, 2006

(30) Foreign Application Priority Data
Feb. 15, 2005 (JP) ............................. 2005-038167

(51) Int. Cl.
*G01V 3/00* (2006.01)
(52) U.S. Cl. ..................................... 324/318; 324/307
(58) Field of Classification Search ................ 324/318, 324/309, 307
See application file for complete search history.

(56) References Cited

U.S. PATENT DOCUMENTS

| | | | |
|---|---|---|---|
| 6,253,101 B1 * | 6/2001 | Seng et al. ................. 600/410 |
| 6,724,923 B2 | 4/2004 | Ma et al. | |
| 2002/0181753 A1* | 12/2002 | Ma et al. ..................... 382/131 |
| 2002/0186870 A1* | 12/2002 | Ma et al. ..................... 382/131 |
| 2005/0234330 A1* | 10/2005 | Yokoi et al. ................. 600/410 |
| 2005/0237056 A1* | 10/2005 | Nabetani ..................... 324/302 |
| 2006/0152220 A1* | 7/2006 | Nabetani et al. ............ 324/309 |

FOREIGN PATENT DOCUMENTS

| | | |
|---|---|---|
| JP | 11-276452 | 10/1999 |
| JP | 2002-355233 | 12/2002 |

* cited by examiner

*Primary Examiner*—Brij Shrivastav
*Assistant Examiner*—Megann E Vaughn
(74) *Attorney, Agent, or Firm*—Nixon & Vanderhye P.C.

(57) ABSTRACT

A magnetic resonance imaging apparatus includes a phased array coil including a plurality of local coils, a pre-scanning unit which pre-scans, before image scanning, an area including at least part of an image scanning area, a determination unit which determines whether each of the local coils is abnormal, based on signals output from the local coils during pre-scanning, and an information supply unit which supplies a user with information indicating an abnormal local coil, if the determination unit determines that the local coils include the abnormal local coil.

32 Claims, 8 Drawing Sheets

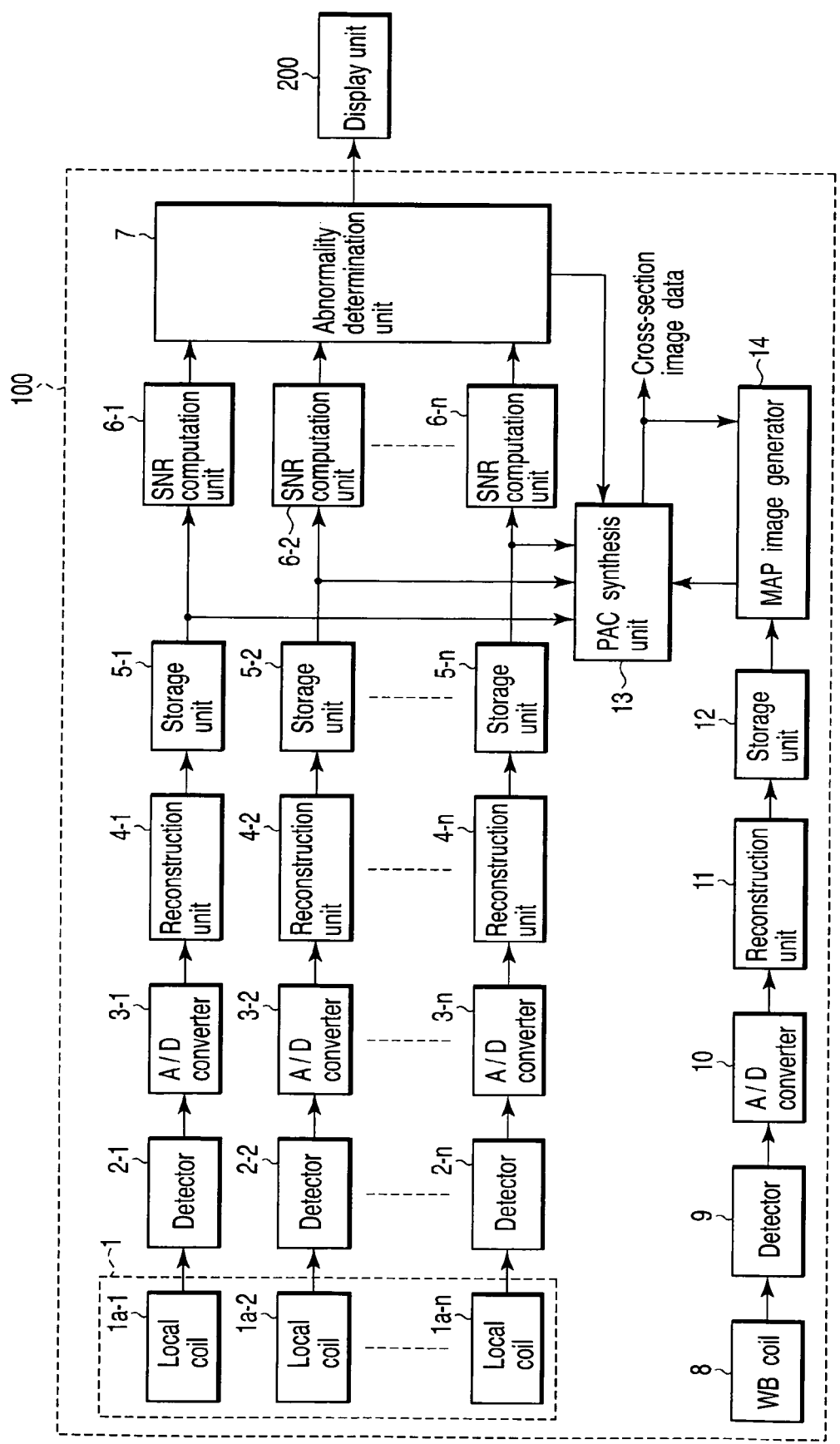
F I G. 1

MAGNETIC RESONANCE IMAGING APPARATUS AND ITS CONTROL METHOD

CROSS-REFERENCE TO RELATED APPLICATIONS

This application is based upon and claims the benefit of priority from prior Japanese Patent Application No. 2005-038167, filed Feb. 15, 2005, the entire contents of which are incorporated herein by reference.

BACKGROUND OF THE INVENTION

1. Field of the Invention

The present invention relates to a magnetic resonance imaging apparatus provided with a phased array coil that includes a plurality of local coils arranged so that the sensitivity area of each local coil overlaps with that of at least one of the other local coils, and relates to a control method for controlling the apparatus.

2. Description of the Related Art

Magnetic resonance imaging (MRI) apparatuses of this type synthesize images based on the outputs of the local coils incorporated in a phased array coil (PAC), thereby reproducing a single image. Accordingly, even if some local coils are abnormal, an image can be reproduced based on the outputs of the other normal local coils.

However, since even the outputs of the abnormal local coils are also synthesized, the signal-to-ratio (SNR) is reduced, degrading the quality of the resultant image. It is difficult for users to determine whether degradation in image quality is caused by some abnormal local coils, with the result that the use of the abnormal local coils may well be continued.

Jpn. Pat. Appln. KOKAI Publication No. 2002-355233, for example, discloses a magnetic resonance imaging apparatus, in which pre-scanning is executed using all local coils to detect any local coil that has a sensitivity area falling outside an area preset for photography, and such a local coil is not used for actual image scanning. In this magnetic resonance imaging apparatus, an abnormal local coil may be considered to have a sensitivity area falling outside the preset area, and hence may not be used for actual image scanning. In this case, however, just because the abnormal local coil is not used, the existence of the abnormality itself is difficult for users to detect.

BRIEF SUMMARY OF THE INVENTION

In light of the above, there is a need for precise recognition of an abnormal local coil by users.

According to a first aspect of the present invention, there is provided a magnetic resonance imaging apparatus comprising: a phased array coil including a plurality of local coils; a pre-scanning unit which pre-scans, before image scanning, an area including at least part of an image scanning area; a determination unit which determines whether each of the local coils is abnormal, based on signals output from the local coils during pre-scanning; and an information supply unit which supplies a user with information indicating an abnormal local coil, if the determination unit determines that the local coils include the abnormal local coil.

According to a second aspect of the present invention, there is provided a magnetic resonance imaging apparatus comprising: a phased array coil including a plurality of local coils; a wide-area coil having a sensitivity area which includes sensitivity areas of the local coils; a pre-scanning unit which pre-scans, before image scanning, an area including at least part of an image scanning area; a determination unit which determines whether each of the local coils is abnormal, based on signals output, during pre-scanning, from the local coils and the wide-area coil at substantially a same scanning position; and an information supply unit which supplies a user with information indicating an abnormal local coil, if the determination unit determines that local coils include the abnormal local coil.

According to a third aspect of the present invention, there is provided a method of controlling a magnetic resonance imaging apparatus with a phased array coil including a plurality of local coils, comprising: pre-scanning, before image scanning, an area including at least part of an image scanning area; determining whether each of the local coils is abnormal, based on signals output from the local coils during pre-scanning; and supplying a user with information indicating an abnormal local coil, if it is determined that the local coils include the abnormal local coil.

According to a fourth aspect of the present invention, there is provided a method of controlling a magnetic resonance imaging apparatus with a phased array coil including a plurality of local coils, and a wide-area coil having a sensitivity area which includes sensitivity areas of the local coils, comprising: pre-scanning, before image scanning, an area including at least part of an image scanning area; determining whether each of the local coils is abnormal, based on signals output, during pre-scanning, from the local coils and the wide-area coil at substantially a same scanning position; and supplying a user with information indicating an abnormal local coil, if it is determined that the local coils include the abnormal local coil.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram illustrating the configuration of the basic components of an MRI apparatus according to a first embodiment of the invention;

DETAILED DESCRIPTION OF THE INVENTION

Figure 2:
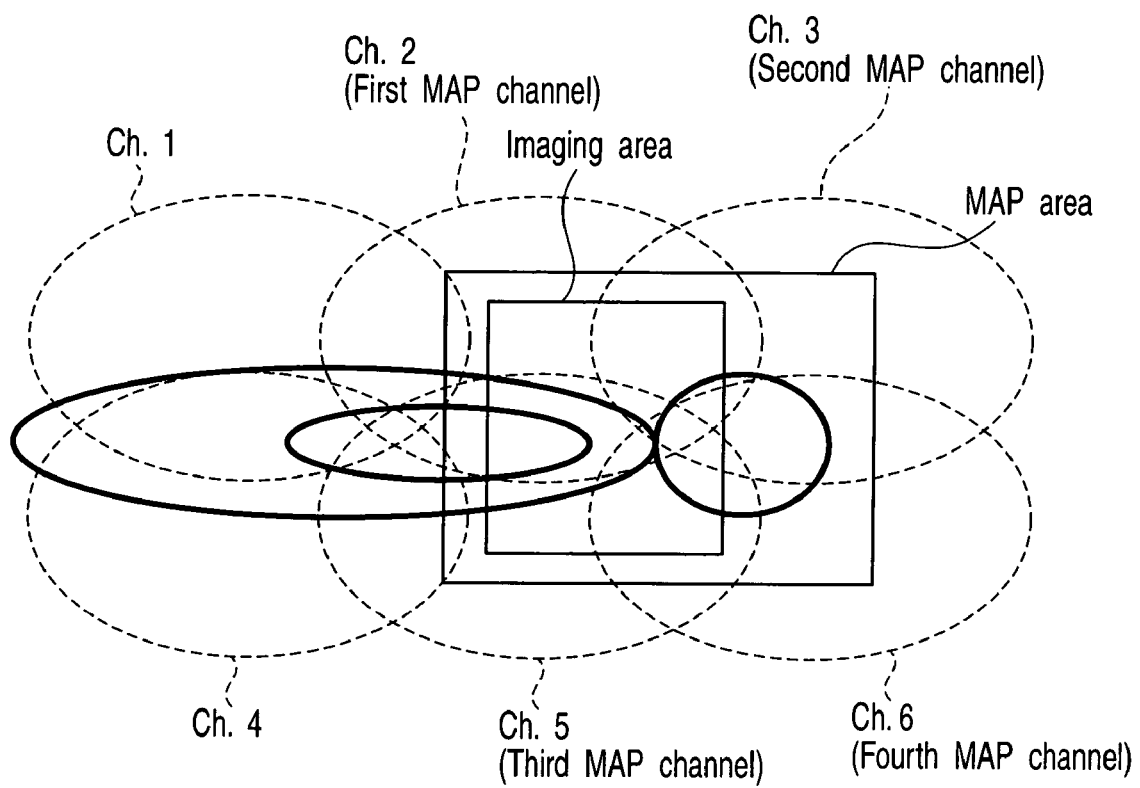
FIG. 2 is a view useful in explaining MAP channels.

Embodiments of the invention will be described with reference to the accompanying drawings.

FIRST EMBODIMENT

FIG. 1 is a block diagram illustrating the configuration of the basic components of a magnetic resonance imaging (MRI) apparatus 100 according to a first embodiment of the invention. Although various components similar to those employed in known MRI apparatuses are employed in the MRI apparatus 100, as well as the components shown in FIG. 1, they are not shown or described.

As shown in FIG. 1, the MRI apparatus 100 comprises a phased array coil 1, detectors 2-1, 2-2, . . . , 2-n, A/D (analog-to-digital) converters 3-1, 3-2, . . . , 3-n, reconstruction units 4-1, 4-2, . . . , 4-n, storage units 5-1, 5-2, . . . , 5-n, SNR computation units 6-1, 6-2, . . . , 6-n, abnormality determination unit 7, whole body coil (WB coil) 8, detector 9, A/D converter 10, reconstruction unit 11, storage unit 12, PAC synthesis unit 13 and MAP image generator.

The phased array coil 1 includes a plurality of local coils 1a-1, 1a-2, . . . , 1a-n. Each combination of corresponding ones of the local coils 1a-1, 1a-2, . . . , 1a-n, detectors 2-1, 2-2, . . . , 2-n, A/D converters 3-1, 3-2, . . . , 3-n, reconstruction units 4-1, 4-2, . . . , 4-n, storage units 5-1, 5-2, . . . , 5-n and SNR computation units 6-1, 6-2, . . . , 6-n provide a one-channel processing system of the phased array coil 1. Hereinafter, the local coils 1a-1, 1a-2, . . . , 1a-n, detectors 2-1, 2-2, . . . , 2-n, A/D converters 3-1, 3-2, . . . , 3-n, reconstruction units 4-1, 4-2, . . . , 4-n, storage units 5-1, 5-2, . . . , 5-n and SNR computation units 6-1, 6-2, . . . , 6-n will be referred to as "the local coils 1a, detectors 2, A/D converters 3, reconstruction units 4, storage units 5 and SNR computation units 6", except when it is necessary to discriminate them from each other.

The local coils 1a-1, 1a-2, . . . , 1a-n are arranged so that the sensitivity area of each of the local coils overlaps with that of at least one of the other local coils. The local coils 1a receive MR signals emitted in their sensitivity areas. The detectors 2 receive signals output from the respective local coils 1a. The A/D converters 3 perform analog-to-digital conversion on the signals output from the respective detectors 2. The reconstruction units 4 reconstruct images based on the signals output from the respective A/D converters 3. The storage units 5 store data output from the reconstruction units 4. The SNR computation units 6 compute SNRs based on the data stored in the storage units 5.

The abnormality determination unit 7 determines whether an abnormality exists in the local coils 1a-1, 1a-2, . . . , 1a-n. If any one of the local coils 1a-1, 1a-2, . . . , 1a-n is abnormal, the abnormality determination unit 7 causes a display unit 200 to display an image indicating the abnormal local coil. The display unit 200 is seen by the operator or observer of the MRI apparatus 100. The display unit 200 may be an external device, or a device incorporated in the MRI apparatus 100, such as a device mounted on an operation table provided on the MRI apparatus 100. Further, the abnormality determination unit 7 may drive a warning device, such as a lighting device, sound device or vibrator, when any one of the local coils 1a-1, 1a-2, . . . , 1a-n is abnormal. As the lighting device, a revolving light, for example, can be used. As the sound device, a loudspeaker or buzzer, for example, can be used. Alternatively, the abnormality determination unit 7 may output a report to an abnormality monitor that automatically monitors the MRI apparatus 100.

The whole body coil 8 is a wide-area coil including the sensitivity areas of all local coils 1a-1, 1a-2, . . . , 1a-n. The detector 9 detects the signal output from the whole body coil 8. The A/D converter 10 digitizes the signal output from the detector 9. The reconstruction unit 11 reconstructs an image based on the signal output from the A/D converter 10. The storage unit 12 stores the data output from the reconstruction unit 11.

The PAC synthesis unit 13 synthesizes data items stored in the storage units 5-1, 5-2, . . . , 5-n, thereby generating a single image that is regarded as an image acquired using the phased array coil 1. The image generated by the PAC synthesis unit 13 is a sensitivity MAP image when MAP scanning is performed, and is data indicating a tomogram when imaging scanning is performed. Further, during imaging scanning, the PAC synthesis unit 13 performs correction based on a MAP image for sensitivity correction generated by the MAP image generator 14 during the synthesis process. A known process is utilized as the correction process.

The MAP image generator 14 generates a MAP image for sensitivity correction corresponding to a variation in sensitivity between the local coils 1a-1, 1a-2, . . . , 1a-n, based on a sensitivity MAP image output from the PAC synthesis unit 13, and the data stored in the storage unit 12. A known process is utilized as the process of generating the MAP image for sensitivity correction.

A description will now be given of the operation of the MRI apparatus 100 constructed as above.

Before imaging scanning for acquiring cross-section image data used for, for example, diagnosis, the MRI apparatus 100 performs MAP scanning for detecting a variation in sensitivity between the local coils 1a-1, 1a-2, . . . , 1a-n. MAP scanning is performed using only the local coils 1a that have sensitivity areas overlapping with the imaging area of imaging scanning. Specifically, assume that the phased array coil 1 contains 6 local coils 1a, and the sensitivity areas of the local coils are distributed as shown in FIG. 2. Further, assume that imaging scanning is performed on the imaging area as shown in FIG. 2. In this case, the sensitivity areas of channels 2, 3, 5 and 6 overlap with the imaging area. Accordingly, the local coils 1a corresponding to the channels 2, 3, 5 and 6 are used for MAP scanning. The local coils 1a corresponding to channels 1 and 4 are not used for MAP scanning. MAP scanning is performed on, for example, the MAP area shown in FIG. 2. In the description below, the channels used for MAP scanning are referred to as the $1^{st}$ to $k^{th}$ MAP channels. Typically, users designate MAP channels.

Figure 3:
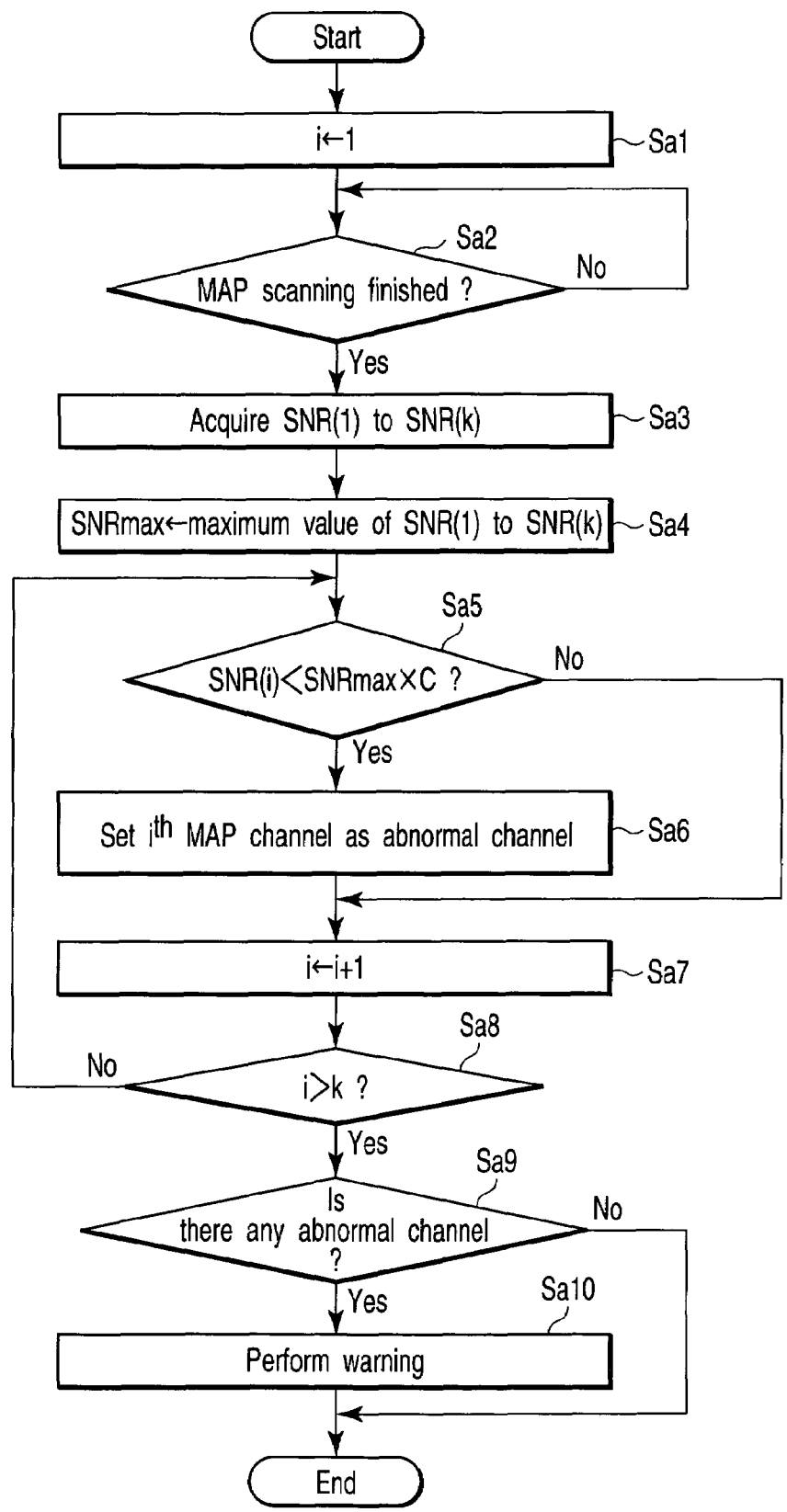
FIG. 3 is a flowchart illustrating the procedure of processing performed by the abnormality determination section appearing in FIG. 1.

To perform MAP scanning, the abnormality determination unit 7 executes the process shown in FIG. 3.

At step Sa1, the abnormality determination unit 7 initializes variable i to 1. At step Sa2, the abnormality determination unit 7 waits for the completion of MAP scanning.

On the other hand, the SNR computing units 6 corresponding to the MAP channels compute SNRs related to the MAP channels, based on the data reconstructed by MAP scanning and stored in the corresponding storage units 5. More specifically, the SNR computing units 6 each select values corresponding to the top 10% of all raw data signal levels (MR signal values) indicating all slices acquired by MAP scanning, and compute the average value $AVE_{high}$ of the selected values. Further, the SNR computing units 6 each select values corresponding to the bottom 10% of all raw data signal levels indicating all slices acquired by MAP scanning, and compute the average value $AVE_{low}$ of the selected values. After that, the SNR computing units 6 computes the SNR of each MAP channel as the ratio of $AVE_{high}$ to $AVE_{low}$. Namely, the SNR is acquired using the following equation (1):

$$SNR = AVE_{high}/AVE_{low} \qquad (1)$$

After the completion of MAP scanning, the abnormality determination unit 7 proceeds from step Sa2 to step Sa3. At step Sa3, the abnormality determination unit 7 acquires SNR(1) to SNR(k) corresponding to the $1^{st}$ to $k^{th}$ MAP channels. At step Sa4, the abnormality determination unit 7 selects the maximum value from SNR(1) to SNR(k), and substitutes the maximum value for variable SNRmax.

At step Sa5, the abnormality determination unit 7 determines whether the following expression (2) is satisfied:

$$SNR(i) < SNR\ max \times C \qquad (2)$$

Where C is a coefficient preset by simulation or estimation, and is lower than 1.

If the abnormality determination unit 7 determines that the expression (2) is satisfied, it proceeds from step Sa5 to step Sa6. At step Sa6, the abnormality determination unit 7 sets the $i^{th}$ channel as an abnormal channel. Subsequently, the abnormality determination unit 7 proceeds to step Sa7. In contrast, if the abnormality determination unit 7 determines that the expression (2) is not satisfied, it proceeds from step Sa5 to step Sa7, skipping over step Sa6. Accordingly, at this time, the $i^{th}$ MAP channel is not set as an abnormal channel.

At step Sa7, the abnormality determination unit 7 increments variable i by 1. At step Sa8, the abnormality determination unit 7 determines whether variable i is k (=the number of MAP channels) or more. The abnormality determination unit 7 iterates steps Sa5 to Sa8 until it is determined that variable i is k or more. Thus, it is determined whether each MAP channel is abnormal. After it is determined that variable i is k or more, i.e., after determination as to all MAP channels is finished, the abnormality determination unit 7 proceeds from step Sa8 to step Sa9.

At step Sa9, the abnormality determination unit 7 determines whether there is a channel set as an abnormal channel. If there is any, the abnormality determination unit 7 proceeds from step Sa9 to step Sa10. At step Sa10, the abnormality determination unit 7 performs a warning process. In the warning process, the abnormality determination unit 7 causes the display unit 200 to display information indicating that a local coil 1a corresponding to the abnormal channel is abnormal. Further, the abnormality determination unit 7 informs the PAC synthesis unit 13 of which one of the local coils 1a is abnormal.

Figure 4:
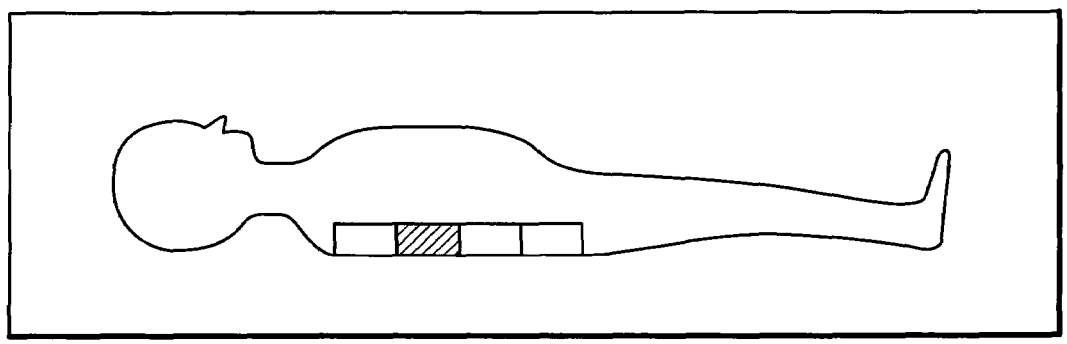
FIG. 4 is a view illustrating an image example that informs a result of an abnormality determination.

The information displayed on the display unit 200 is, for example, the image shown in FIG. 4. The image shown in FIG. 4 indicates results of abnormality determination acquired by a 4-channel phased array coil for the spine. More specifically, the image indicates that four local coils are arranged along the axis of the body, and they include one abnormal local coil (indicated by hatching).

From this image, users can easily recognize that there is an abnormal local coil, and the abnormal local coil is the hatched one.

The information displayed on the display unit 200 may be such a message as the following:

"Coil channel 3 [left top] signal is too weak. Confirm coil configuration. To compensate for this problem, increase average XX times, and call service engineer."

This message indicates that the third channel is determined abnormal.

There are many cases where even if a user recognizes occurrence of an abnormality from such a display as the above, imaging must be continued until the abnormality is eliminated (the abnormal local coil is repaired). In preparation for such cases, the following information may be displayed:

(1) If the ratio of the PAC coil to the WB coil, which is used for sensitivity correction, is A as an average near an abnormal channel, and B as an average near a peripheral channel, it is proposed to increase the average to $\sqrt{(B/A)}$;

(2) In parallel imaging, if it is possible to reduce the magnification of the speed of scanning, it is proposed to do so. For example, if in the above-mentioned conditions, the present magnification is S and $S/(\sqrt{(B/A)}) > 1$, it is proposed to reduce the magnification.

(3) In parallel imaging, it is proposed to change the direction of unfolding in order to reduce the artifact. For instance, a map of g is generated from an unfolding matrix, and the maximum values of g acquired in the present unfolding direction and a certain changed unfolding direction are compared. If the maximum value of g is lower in the changed unfolding direction, it is proposed to change the present unfolding direction to the changed one. At this time, such a message as "To reduce parallel imaging unfolding error, change unfolding direction" is displayed.

(4) It is proposed to change both the above-mentioned average and magnification.

If such a display as the above is provided, and the user takes countermeasures based on the display, more satisfactory imaging can be realized than the case where no countermeasures are taken during the repair of the abnormal local coil.

After the warning process, the abnormality determination unit 7 finishes the process shown in FIG. 3. Note that if there is no abnormal channel, the abnormality determination unit 7 finishes the process of FIG. 3 after step Sa9, without executing step Sa10.

The PAC synthesis unit 13 detects whether each of the local coils 1a is abnormal, based on the signal from the abnormality determination unit 7. During image scanning, the PAC synthesis unit 13 does not use, for PAC synthesis, the image(s) corresponding to the channel(s) to which the abnormal local coil(s) 1a belongs.

As described above, in the MRI apparatus 100 of the first embodiment, the local coil(s) 1a corresponding to that (those) of the MAP channels, in which the SNR is significantly lower than the maximum value SNRmax, is determined abnormal, and a warning indicating this fact is output. Since in MAP scanning, each MAP channel generally overlaps with the imaging area, in normal conditions, MR signals corresponding to all slices of MAP scanning have to be received. Therefore, concerning a channel in which the SNR is significantly lower than the maximum value SNRmax, it is considered that although an MR signal is generated, it is not received. Namely, the local coil 1a corresponding to this channel can be determined abnormal. When any abnormal local coil 1a is detected, a warning indicating this fact is output, which enables the user or manager to promptly take countermeasures against the abnormality.

Further, since the local coil(s) 1a determined abnormal is not used for image scanning, even if image scanning is executed before a repairing process based on the warning is done, photography can be performed without reduction of SNR due to a signal received by the abnormal local coil 1a.

SECOND EMBODIMENT

Figure 5:
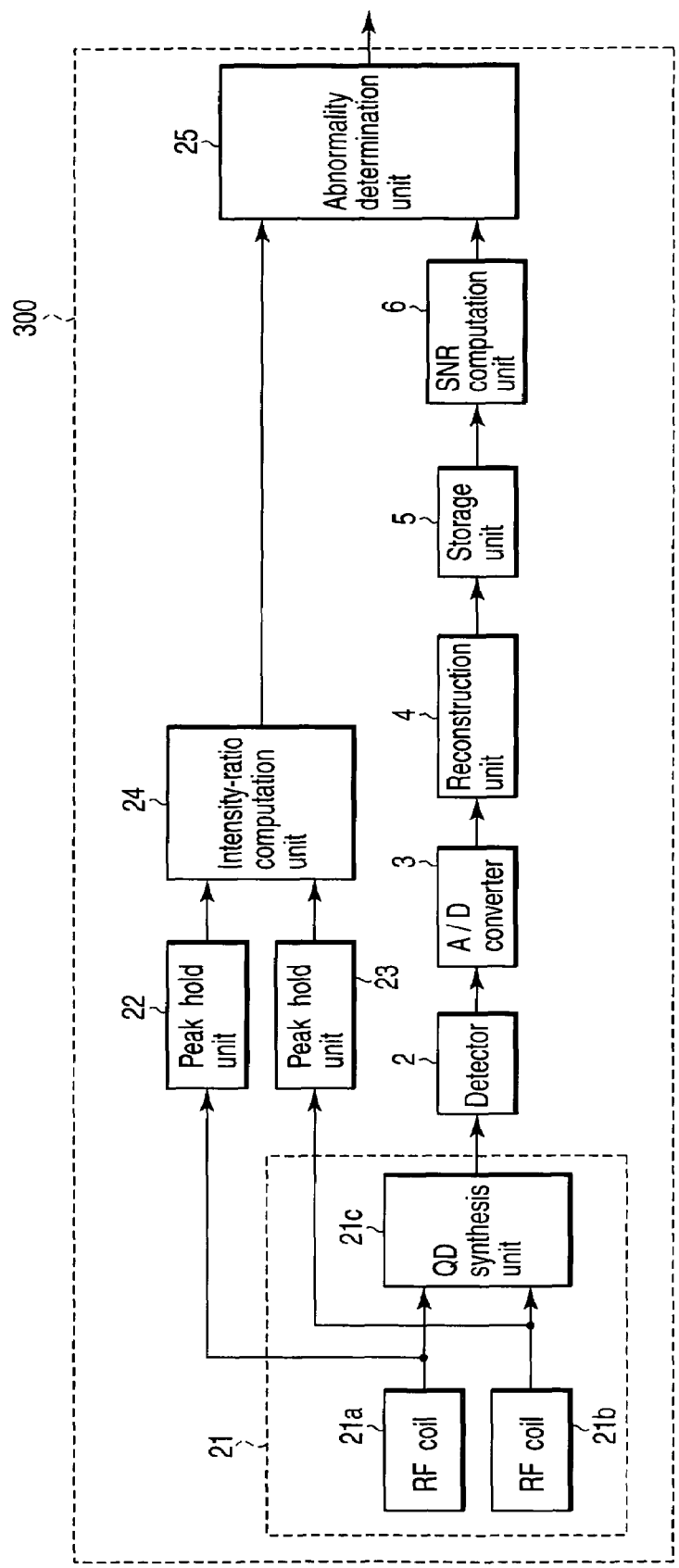
FIG. 5 is a block diagram illustrating the configuration of the basic components of an MRI apparatus according to a second embodiment of the invention.

FIG. 5 is a block diagram illustrating the configuration of the basic components of an MRI apparatus 300 according to a second embodiment. The greater part of the MRI apparatus 300 is similar to the MRI apparatus 100. FIG. 5 shows only components different from those of the MRI apparatus 100. In FIG. 5, elements similar to those of FIG. 1 are denoted by corresponding reference numbers, and no detailed descriptions will be given thereof.

The MRI apparatus 300 differs from the MRI apparatus 100 only in that the former employs a phased array coil including quadrature coils (QD coils) as local coils, instead of the phased array coil 1. FIG. 5 only shows a processing system corresponding to one channel incorporated in the phased array coil. Namely, in the MRI apparatus 300, the processing system corresponding to one channel comprises a detector 2, A/D converter 3, reconstruction unit 4, storage units 5, SNR computation units 6, QD coil 21, peak hold units 22 and 23 and intensity-ratio computation unit 24. The MRI apparatus 300 incorporates n processing systems, in total, which are similar to the above processing system, as in the MRI apparatus 100. The MRI apparatus 300 also incorporates whole body (WB) coil 8, detector 9, A/D converter 10, reconstruction unit 11, storage unit 12, PAC synthesis unit 13 and MAP image generator 14, although they are not shown.

The QD coil 21 includes RF coils 21a and 21b and QD synthesis unit 21c. The RF coils 21a and 21b receive respective MR signals having their phases shifted by 90 degrees. The QD synthesis unit 21c performs QD synthesis of signals output from the RF coils 21a and 21b.

The peak hold units 22 and 23 receive signals output from the RF coils 21a and 21b, respectively, and detect and hold the respective peak values of the signals. The intensity-ratio computation unit 24 computes the ratio between the absolute values of the peak values held by the peak hold units 22 and 23. Namely, the intensity-ratio computation unit 24 computes the intensity ratio (hereinafter referred to as "IQ intensity ratio") of the I channel signal of the QD coil 21 to the Q channel signal of the coil.

The MRI apparatus 300 further incorporates an abnormality determination unit 25, instead of the abnormality determination unit 7 employed in the MRI apparatus 100. The abnormality determination unit 25 receives IQ intensity ratios computed by the intensity-ratio computation units 24 of all processing systems, as well as SNRs computed by the SNR computation units 6 of the processing systems. Based on the received SNRs and IQ intensity ratios, the abnormality determination unit 25 determines whether there is an abnormality in the QD coil 21 of each processing system. If any QD coil 21 is abnormal, the abnormality determination unit 25 causes the display unit 200 to display an image indicating the fact.

The operation of the MRI apparatus 300 constructed as above will be described.

When MAP scanning is performed, the RF coils 21a and 21b belonging to each MAP channel output an I-component signal and Q-component signal, respectively. These signals are synthesized by the QD synthesis unit 21c, and at the same time, the peak values Imax and Qmax of the I-component and Q-component signals are detected by the peak hold units 22 and 23, respectively.

After that, the intensity-ratio computation unit 24 computes the IQ intensity ratio Riq using the following equation (3):

$$Riq = abs(I\ max)/abs(Q\ max) \quad (3)$$

Figure 6:
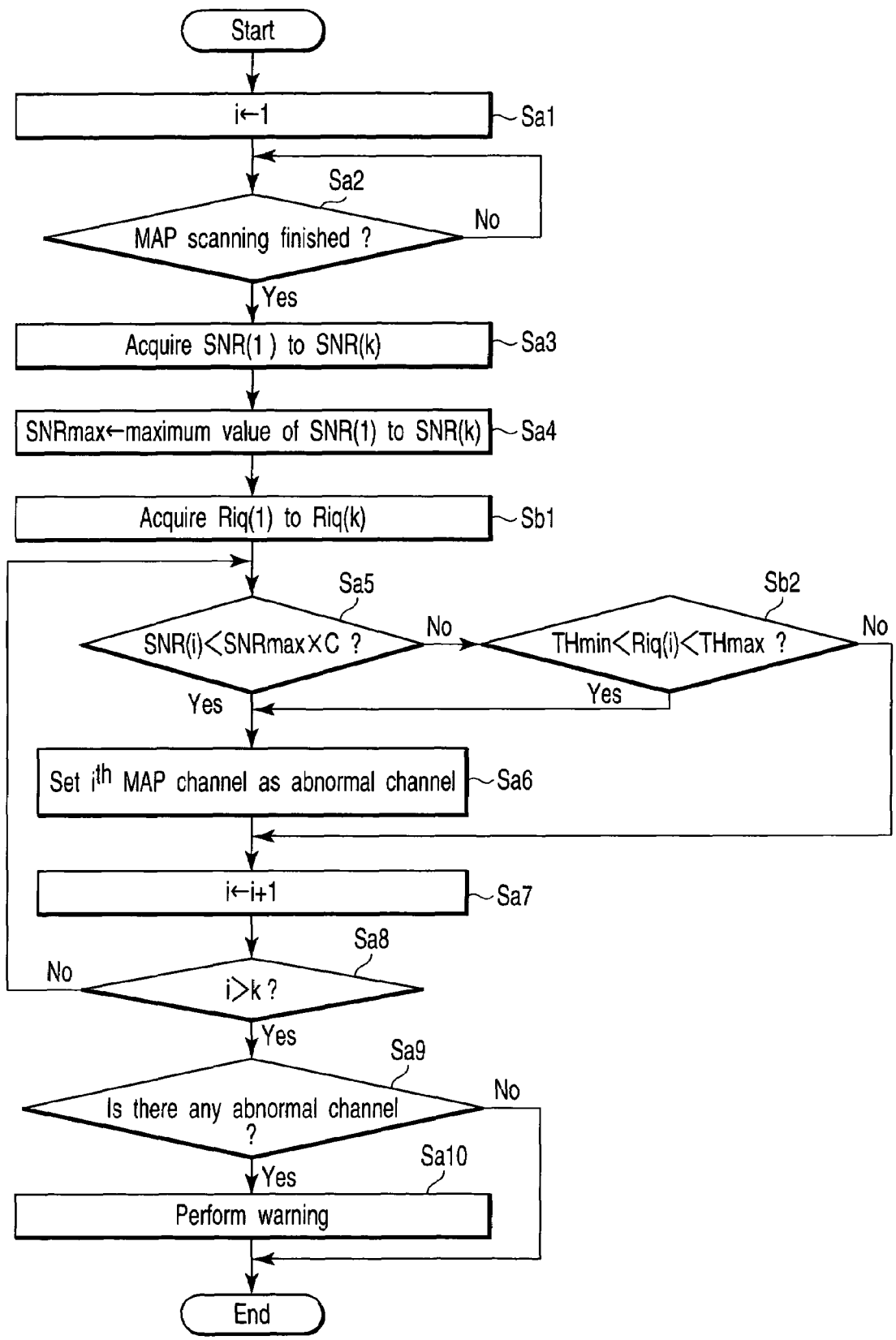
FIG. 6 is a flowchart illustrating the procedure of processing performed by the abnormality determination section appearing in FIG. 5.

On the other hand, before performing MAP scanning, the abnormality determination unit 25 performs the process shown in FIG. 6. In FIG. 6, steps similar to those of FIG. 3 are denoted by corresponding reference numbers, and no detailed descriptions will be given thereof.

The abnormality determination unit 25 proceeds to step Sb1 after executing steps Sa1 to Sa4 as in the first embodiment. At step Sb1, the abnormality determination unit 25 acquires, as Riq(1) to Riq(k), IQ intensity ratios corresponding to the $1^{st}$ to $k^{th}$ MAP channels.

Subsequently, the abnormality determination unit 25 executes step Sa5 as in the first embodiment. At this step, if it is determined that the expression (2) is not satisfied, the abnormality determination unit 25 proceeds from step Sa5 to Sb2. At step Sb2, the abnormality determination unit 25 determines whether the following expression (4) is satisfied:

$$TH\ min < Riq(i) < Th\ max \quad (4)$$

where THmin and THmax are threshold values indicating the upper and lower limits of a range that is set in light of the minimum and maximum values of the IQ intensity ratio acquired when the QD coil 21 is normal.

If it is determined that the expression (4) is satisfied, the abnormality determination unit 25 proceeds from step Sb2 to step Sa7.

At this time, the abnormality determination unit 25 executes steps Sa6 to Sa10 as in the first embodiment.

Thus, in the second embodiment, a QD coil (QD coils) 21 corresponding to a MAP channel (MAP channels), in which the SNR is significantly lower than the maximum value SNRmax and the IQ intensity ratio falls outside the allowable range, is determined abnormal, and a warning indicating this is output. Even if only one of the RF coils 21a and 21b of the QD coil 21 is abnormal, the signal intensity acquired after QD synthesis is not significantly reduced, which makes it difficult to detect an abnormality due to reduction of SNR. Even in such a case, the second embodiment can reliably detect the abnormality.

THIRD EMBODIMENT

Figure 7:
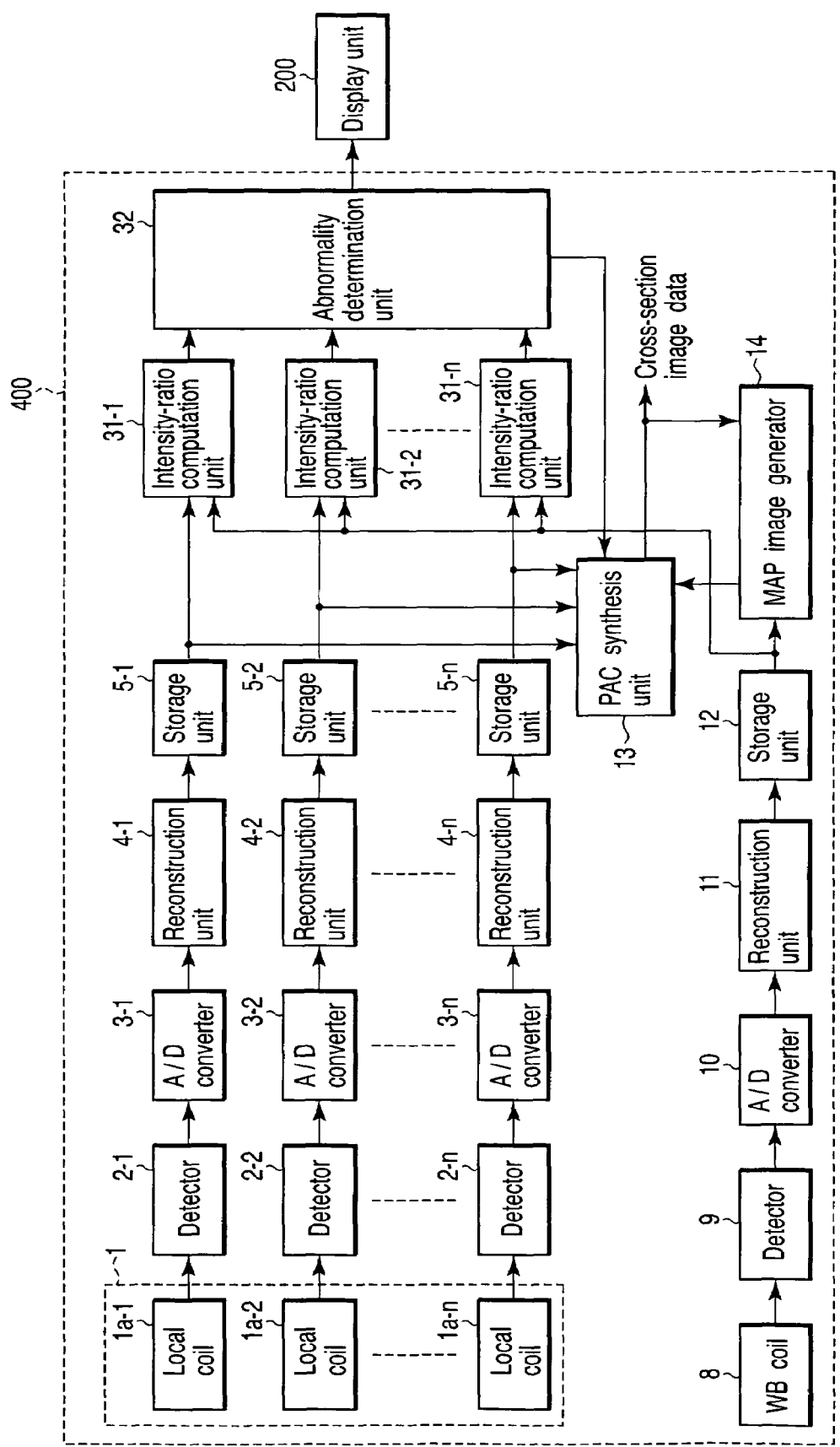
FIG. 7 is a block diagram illustrating the configuration of the basic components of an MRI apparatus according to a third embodiment of the invention.

FIG. 7 is a block diagram illustrating the configuration of the basic components of an MRI apparatus 400 according to a third embodiment. The greater part of the MRI apparatus 400 is similar to the MRI apparatus 100. In FIG. 7, elements similar to those of FIG. 1 are denoted by corresponding reference numbers, and no detailed descriptions will be given thereof.

As can be seen from FIG. 7, the MRI apparatus 400 comprises a phased array coil 1, detectors 2-1, 2-2, . . . , 2-n, A/D converters 3-1, 3-2, . . . , 3-n, reconstruction units 4-1, 4-2, . . . , 4-n, storage units 5-1, 5-2, . . . , 5-n, whole body coil (WB coil) 8, detector 9, A/D converter 10, reconstruction unit 11, storage unit 12, PAC synthesis unit 13, MAP image generator 14, intensity-ratio computation units 31-1, 31-2, . . . , 31-n and abnormality determination unit 32. Namely, the MRI apparatus 400 incorporates the intensity-ratio computation units 31-1, 31-2, . . . , 31-n and abnormality determination unit 32, instead of the SNR computation units 6-1, 6-2, . . . , 6-n and abnormality determination unit 7 in the MRI apparatus 100. The intensity-ratio computation units 31-1, 31-2, . . . , 31-n will also hereinafter be referred to as "intensity-ratio computation units 31," except when they are needed to be discriminated.

The intensity-ratio computation units 31 each compute the ratio of the reception intensity of the corresponding local coil 1a to the reception intensity of the whole body coil 8, based on the data stored in the storage units 5 and 12.

The abnormality determination unit 32 determines whether each of the local coils 1a-1, 1a-2, . . . , 1a-n is abnormal. If any one of the local coils 1a-1, 1a-2, . . . , 1a-n is abnormal, the abnormality determination unit 32 causes the display unit 200 to display an image indicating the fact.

The operation of the MRI apparatus 400 constructed as above will be described.

When MAP scanning is performed, the intensity-ratio computation unit 31 corresponding to each MAP channel determines the top 10% of the signal intensity values contained in the reception MAP image indicated by the data stored in the corresponding storage unit 5, and also determines the positions at which the signal intensity values are detected. After that, the intensity-ratio computation unit 31 computes the average of the top 10% signal intensity values, and sets it as a local intensity value. Further, the intensity-ratio computation unit 31 determines the signal intensity value at the same position on a whole body image, indicated by the data stored in the storage unit 12, as each of the determined positions. Subsequently, the intensity-ratio computation unit 31 computes the average of the signal intensity values in the whole body image, and sets it as a whole body intensity value. Lastly, the intensity-ratio computation unit 31 computes an intensity ratio Rlw using the following equation (5):

$$Rlw = \text{local intensity value/whole body intensity value} \quad (5)$$

Figure 8:
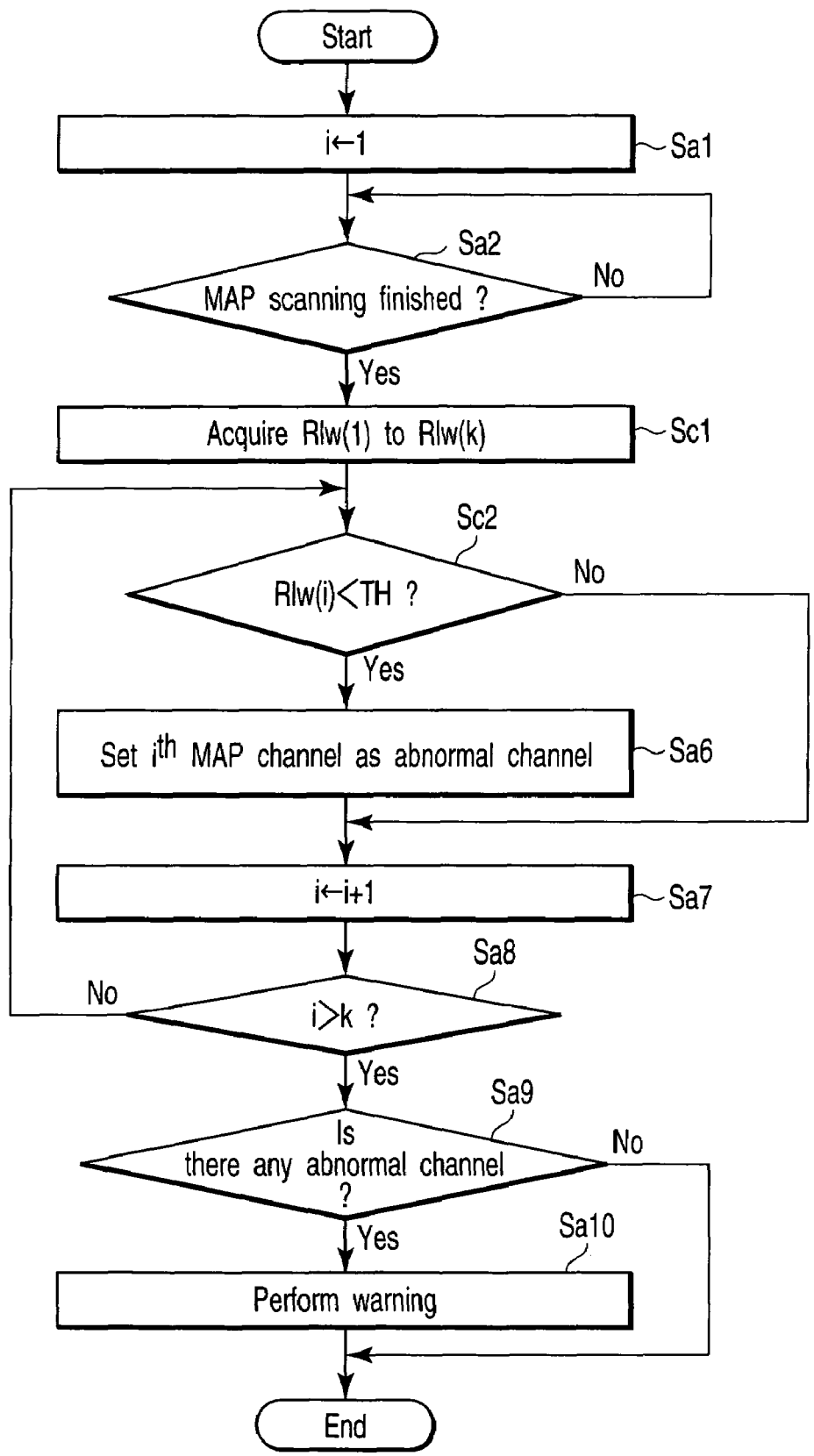
FIG. 8 is a flowchart illustrating the procedure of processing performed by the abnormality determination section appearing in FIG. 6.

On the other hand, when MAP scanning is performed, the abnormality determination unit 32 executes the process shown in FIG. 8. In FIG. 8, steps similar to those of FIG. 3 are denoted by corresponding reference numbers, and no detailed descriptions will be given thereof.

The abnormality determination unit 32 proceeds to step Sc1 after executing steps Sa1 and Sa2 as in the first embodiment. At step Sc1, the abnormality determination unit 32 acquires, as Rlw(1) to Rlw(k), the intensity ratios Rlw corresponding to the $1^{st}$ to $k^{th}$ MAP channels.

Subsequently, at step Sc2, the abnormality determination unit 32 determines whether the following expression (6) is satisfied:

$$Rlw(i) < TH \quad (6)$$

where TH is a threshold value set in light of the reception levels of the local coils 1a and whole body coil 8.

If it is determined that the expression (6) is satisfied, the abnormality determination unit 32 proceeds from step Sc1 to Sa6. In contrast, if it is determined that the expression (6) is not satisfied, the abnormality determination unit 32 proceeds from step Sc1 to Sa7.

After that, the abnormality determination unit 32 executes steps Sa6 to Sa10 as in the first embodiment.

Thus, in the third embodiment, a local coil (local coils) 1a corresponding to a MAP channel (MAP channels), in which the ratio of a signal intensity at a certain position on the reception MAP image to that at the same position on the whole body image as the certain position is not higher than the threshold value TH, is determined abnormal, and a warning indicating this is output. Since the whole body coil 8 has a sensitivity area that includes the sensitivity areas of all the local coils 1a, an MR signal is received at the same position between each local coil 1a and the whole body coil 8 during MAP scanning. Since each local coil 1a has a higher reception level than the whole body coil 8, they exhibit different reception intensity levels when they receive an MR signal emitted at the same position. However, the ratio of the reception level of each local coil 1a to that of the whole body coil 8 is substantially constant. Accordingly, if the intensity ratio Rlw is reduced, it can be determined that the reception level of the corresponding local coil 1a is reduced, namely, the corresponding local coil 1a is abnormal. When such an abnormal local coil 1a is detected, a warning indicating it is output, with the result that the user or manager can promptly take countermeasures against the abnormal local coil 1a.

Each of the above-described embodiments can be modified in various ways as described below.

In the first or second embodiment, the sum of raw data signal intensity values may be utilized instead of the SNR.

In the first or second embodiment, the number of samples for computing the average values $AVE_{high}$ and $AVElow$ can be set to an arbitrary value.

In the second embodiment, if one of the RF coils 21a and 21b included in the QD coil 21 is determined abnormal, the level acquired by multiplying, by a constant value, the level of the output signal of the normal RF coil, i.e., the output signal of a higher intensity, may be used as the output level of the QD coil 21. The constant value is preset in light of the difference between the reception levels of the RF coils 21a and 21b. If the RF coils 21a and 21b have the same reception level, it is sufficient if the constant value is set to, for example, $\sqrt{2}$.

In the second embodiment, since the reception intensity of each QD coil 21 is varied by the geometrical arrangement of the QD coils 21 or the used portion of each QD coil 21, the threshold values THmin and THmax may be varied between channels in accordance with the arrangement or used portion.

In the second embodiment, the signal intensity ratio acquired before or after QD synthesis may be used instead of the IQ intensity ratio Riq.

In the third embodiment, the number of samples for computing the local intensity value can be set to an arbitrary value.

In each embodiment, determination of an abnormality in a local coil may be performed based on the result of pre-scanning other than MAP scanning, such as scanning for shimming.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a phased array coil including a plurality of local coils;
   a pre-scanning unit which pre-scans, before image scanning, an area including at least part of an image scanning area;
   a determination unit which determines whether each of the local coils is abnormal, based on signals output from the local coils during pre-scanning; and
   an information supply unit which supplies a user with information indicating an abnormal local coil, if the determination unit determines that the local coils include the abnormal local coil.

2. The magnetic resonance imaging apparatus according to claim 1, wherein:
the local coils have sensitivity areas, each of the sensitivity areas overlapping with at least one of other ones of the sensitivity areas;
the pre-scanning unit pre-scans an area including the entire image scanning area, using those ones of the local coils which have sensitivity areas each including part of the image scanning area; and
the determination unit compares signals output from those local coils used for pre-scanning by the pre-scanning unit, thereby determining whether the local coils include the abnormal local coil.

3. The magnetic resonance imaging apparatus according to claim 2, wherein the determination unit includes:
a computation unit which computes, as a comparative value set for each one of those local coils used for the pre-scanning, a ratio of an average of top intensity levels of signals output from said each one of those local coils and corresponding to all slices of the pre-scanning by said each one of those local coils, to an average of bottom intensity levels of the signals output from said each one of those local coils and corresponding to all the slices, the computation unit alternatively computing, as the comparative value, a sum of intensity levels of the signals corresponding to all the slices; and
a unit which determines that one of the local coils corresponding to the comparative value is the abnormal local coil, if the comparative value is lower than a maximum value set for the comparative value, by a preset degree of the maximum value.

4. The magnetic resonance imaging apparatus according to claim 1, wherein the information supply unit causes a display unit to display an image indicating which of the local coils is the abnormal local coil.

5. The magnetic resonance imaging apparatus according to claim 4, wherein the image indicates, on an image indicating an arrangement of the local coils, which of the local coils is the abnormal local coil.

6. The magnetic resonance imaging apparatus according to claim 1, further comprising a unit which performs the image scanning using those ones of the local coils which are other than the abnormal local coil, if the determination unit determines that the local coils include the abnormal local coil.

7. The magnetic resonance imaging apparatus according to claim 1, wherein:
each of the local coils is a quadrature coil for synthesizing signals of two orthogonal channels; and
the determination unit determines that each of the local coils is abnormal, also when an intensity ratio between the signals of the two channels falls outside a preset range.

8. The magnetic resonance imaging apparatus according to claim 1, wherein:
each of the local coils is a quadrature coil for synthesizing signals of two orthogonal channels; and
the determination unit determines that each of the local coils is abnormal, also when a preset value is less than an intensity ratio between signals acquired before and after synthesis.

9. A magnetic resonance imaging apparatus comprising:
a phased array coil including a plurality of local coils;
a wide-area coil having a sensitivity area which includes sensitivity areas of the local coils;
a pre-scanning unit which pre-scans, before image scanning, an area including at least part of an image scanning area;
a determination unit which determines whether each of the local coils is abnormal, based on signals output, during pre-scanning, from the local coils and the wide-area coil at substantially a same scanning position; and
an information supply unit which supplies a user with information indicating an abnormal local coil, if the determination unit determines that local coils include the abnormal local coil.

10. The magnetic resonance imaging apparatus according to claim 9, wherein the determination unit determines whether each of the local coils is abnormal, based on an intensity ratio of the signal output from each of the local coils, to the wide-area coil.

11. The magnetic resonance imaging apparatus according to claim 9, wherein:
the pre-scanning unit pre-scans an area including the entire image scanning area, using those ones of the local coils which each include part of the image scanning area; and
the determination unit determines whether each of those local coils used for the pre-scanning is abnormal.

12. The magnetic resonance imaging apparatus according to claim 9, wherein the information supply unit causes a display unit to display an image indicating which of the local coils is the abnormal local coil.

13. The magnetic resonance imaging apparatus according to claim 12, wherein the image indicates, on an image indicating an arrangement of the local coils, which of the local coils is the abnormal local coil.

14. The magnetic resonance imaging apparatus according to claim 9, further comprising a unit which performs the image scanning using those ones of the local coils which are other than the abnormal local coil, if the determination unit determines that the local coils include the abnormal local coil.

15. The magnetic resonance imaging apparatus according to claim 9, wherein:
each of the local coils is a quadrature coil for synthesizing signals of two orthogonal channels; and
the determination unit determines that each of the local coils is abnormal also when an intensity ratio between the signals of the two channels falls outside a preset range.

16. The magnetic resonance imaging apparatus according to claim 9, wherein:
each of the local coils is a quadrature coil for synthesizing signals of two orthogonal channels; and
the determination unit determines that each of the local coils is abnormal, also when a preset value is less than an intensity ratio between signals acquired before and after synthesis.

17. A method of controlling a magnetic resonance imaging apparatus with a phased array coil including a plurality of local coils, comprising:
pre-scanning, before image scanning, an area including at least part of an image scanning area;
determining whether each of the local coils is abnormal, based on signals output from the local coils during pre-scanning; and supplying a user with information indicating an abnormal local coil, if it is determined that the local coils include the abnormal local coil.

18. The method according to claim 17, wherein:
the local coils have sensitivity areas, each of the sensitivity areas overlapping with at least one of other ones of the sensitivity areas;
an area including the entire image scanning area is scanned, using those ones of the local coils which have sensitivity areas each including part of the image scanning area; and
signals output from the local coils used for pre-scanning are compared, thereby determining whether the local coils include the abnormal local coil.

19. The method according to claim 18, wherein the determining whether each of the local coils is abnormal includes:
computing, as a comparative value set for each one of those local coils used for the pre-scanning, a ratio of an average of top intensity levels of signals output from said each one of those local coils and corresponding to all slices of the pre-scanning by said each one local coil, to an average of bottom intensity levels of the signals output from said each one of those local coils and corresponding to all the slices, alternatively computing, as the comparative value, a sum of intensity levels of the signals corresponding to all the slices; and
determining that one of the local coils corresponding to the comparative value is the abnormal local coil, if the comparative value is lower than a maximum value set for the comparative value, by a preset degree of the maximum value.

20. The method according to claim 17, wherein for supplying the information, an image indicating which of the local coils is the abnormal local coil is displayed on a display unit.

21. The method according to claim 20, wherein the image indicates, on an image indicating an arrangement of the local coils, which of the local coils is the abnormal local coil.

22. The method according to claim 17, wherein the image scanning is performed using those ones of the local coils which are other than the abnormal local coil, if it is determined that the local coils include the abnormal local coil.

23. The method according to claim 17, wherein:
each of the local coils is a quadrature coil for synthesizing signals of two orthogonal channels; and
each of the local coils is determined abnormal also when an intensity ratio between the signals of the two channels falls outside a preset range.

24. The method according to claim 17, wherein:
each of the local coils is a quadrature coil for synthesizing signals of two orthogonal channels; and
it is determined that each of the local coils is abnormal, also when a preset value is less than an intensity ratio between signals acquired before and after synthesis.

25. A method of controlling a magnetic resonance imaging apparatus with a phased array coil including a plurality of local coils, and a wide-area coil having a sensitivity area which includes sensitivity areas of the local coils, comprising:
pre-scanning, before image scanning, an area including at least part of an image scanning area;
determining whether each of the local coils is abnormal, based on signals output, during pre-scanning, from the local coils and the wide-area coil at substantially a same scanning position; and
supplying a user with information indicating an abnormal local coil, if it is determined that the local coils include the abnormal local coil.

26. The method according to claim 25, wherein the determining whether each of the local coils is abnormal includes determining whether each of the local coils is abnormal, based on an intensity ratio of the signal output from each of the local coils, to the wide-area coil.

27. The method according to claim 25, wherein:
the pre-scanning includes pre-scanning an area including the entire image scanning area, using those ones of the local coils which each include part of the image scanning area; and
the determining whether each of the local coils is abnormal includes determining whether each of those local coils used for the pre-scanning is abnormal.

28. The method according to claim 25, wherein for supplying the information, an image indicating which of the local coils is the abnormal local coil is displayed on a display unit.

29. The method according to claim 28, wherein the image indicates, on an image indicating an arrangement of the local coils, which of the local coils is the abnormal local coil.

30. The method according to claim 25, wherein the image scanning is performed using those ones of the local coils which are other than the abnormal local coil, if it is determined that the local coils include the abnormal local coil.

31. The method according to claim 25, wherein:
each of the local coils is a quadrature coil for synthesizing signals of two orthogonal channels; and
each of the local coils is determined abnormal also when an intensity ratio between the signals of the two channels falls outside a preset range.

32. The method according to claim 25, wherein:
each of the local coils is a quadrature coil for synthesizing signals of two orthogonal channels; and
it is determined that each of the local coils is abnormal, also when a preset value is less than an intensity ratio between signals acquired before and after synthesis.

* * * * *